US010468083B1

United States Patent
Jaiswal et al.

(10) Patent No.: US 10,468,083 B1
(45) Date of Patent: Nov. 5, 2019

(54) INTEGRATED CIRCUITS WITH LOOK UP TABLES, AND METHODS OF PRODUCING AND OPERATING THE SAME

(71) Applicant: GLOBALFOUNDRIES, Inc., Grand Cayman (KY)

(72) Inventors: Akhilesh Jaiswal, Malta, NY (US); Ajey Poovannummoottil Jacob, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/010,841

(22) Filed: Jun. 18, 2018

(51) Int. Cl.
| G11C 5/06 | (2006.01) |
| G11C 11/16 | (2006.01) |
| H01L 43/02 | (2006.01) |
| H01F 10/32 | (2006.01) |
| H01L 43/12 | (2006.01) |
| H01L 43/10 | (2006.01) |

(52) U.S. Cl.
CPC ........ *G11C 11/1675* (2013.01); *G11C 11/161* (2013.01); *G11C 11/1673* (2013.01); *H01F 10/3254* (2013.01); *H01L 43/02* (2013.01); *H01L 43/12* (2013.01); *H01L 43/10* (2013.01)

(58) Field of Classification Search
CPC .............. G11C 11/1675; G11C 11/161; G11C 11/1673; H01F 10/3254; H01L 43/02; H01L 43/12
USPC .......................................................... 365/158
See application file for complete search history.

(56) References Cited

U.S. PATENT DOCUMENTS

| 9,368,208 B1 * | 6/2016 | Marshall ............ G11C 14/0081 |
| 9,979,401 B2 * | 5/2018 | Pan ........................ H01L 27/222 |
| 2014/0321199 A1 * | 10/2014 | Han .................... G11C 13/0002 |
| | | 365/158 |

OTHER PUBLICATIONS

Dorrance et al., "Diode-MTJ Crossbar Memory Cell Using Voltage-Induced Unipolar Switching for High-Density MRAM", IEEE Electronc Device Letters, Jun. 6, 2013, pp. 753-755, vol. 34, No. 6.
Jaiswal et al., "MESL: Proposal for a Non-volatile Cascadable Magneto-Electric Spin Logic", Scientific Reports, 2017, 7, 39793; doi: 10.1038/srep39793.
Manipatruni et al., "Spin-Orbit Logic with Magnetoelectric Switching: A Multi-Generation Scalable Charge Mediated Nonvolatile Spintronic Logic", 60 pages, https://arxiv.org/pdf/1512.05428.pdf.

* cited by examiner

*Primary Examiner* — Xiaochun L Chen
(74) *Attorney, Agent, or Firm* — Yee Tze Lim; Hoffman Warnick LLC

(57) ABSTRACT

Integrated circuits and methods of operating and producing the same are provided. In an exemplary embodiment, an integrated circuit includes a look up table with a first and second memory cell. The first memory cell includes a first magneto electric (ME) layer, a first free layer adjacent to the first ME layer, and a first fixed layer. The second memory cell includes a second ME layer, a second free layer adjacent to the second ME layer, and a second fixed layer. A first word line is in direct communication with the first and second free layers, wherein direct communication is a connection through zero, one, or more intervening components that are electrical conductors. A first bit line is in direct communication with the first ME layer, and a second bit line is in direct communication with the second ME layer.

20 Claims, 3 Drawing Sheets

US 10,468,083 B1

INTEGRATED CIRCUITS WITH LOOK UP TABLES, AND METHODS OF PRODUCING AND OPERATING THE SAME

TECHNICAL FIELD

The technical field generally relates to integrated circuits with look up tables and methods of producing and operating the same, and more particularly relates to integrated circuits with look up tables having a smaller footprint than traditional look up tables, and methods of producing and operating the same.

BACKGROUND

Many integrated circuits include field programmable gate array systems that incorporate an array of look up tables. A look up table transforms an input data into an output data that is different from the input data, where the output data is typically more desirable. The look up table(s) can simplify some computing applications, and this can save computing time. For example, look up tables have been used to calculate the trigonometric sine function. The look up table can pre-calculate several sine values, and the integrated circuit can then retrieve the closest sine value from the look up table instead of independently calculating it. In some embodiments, the integrated circuit may interpolate the sine value from two values retrieved from the look up table(s). This reduces the computation time because the sine value is essentially retrieved instead of being calculated.

Many look up tables can be written to, so the look up table can be converted from one function to another. In many embodiments, the look up table(s) have separate read and write circuits, where the read circuit is utilized to provide an input to the look up table and then retrieve the desired output. The write circuit is utilized when the look up table is converted from one function to another, such as from sine values to cosine values. Many other functions are also possible. The look up table includes a plurality of memory cells, and each memory cell is typically protected by a transistor within the write circuit to prevent unintended changes when other memory cells are written over. The large quantity of transistors requires space in the integrated circuit, and space is limited.

Accordingly, it is desirable to provide integrated circuits with look up tables that limit the amount of space required for operation of the look up tables, and methods of producing and operating the same. In addition, it is desirable to provide look up tables with memory cells, where reduced energy is required to write over the memory cells, and methods of producing and operating the same. Furthermore, other desirable features and characteristics of the present embodiments will become apparent from the subsequent detailed description and the appended claims, taken in conjunction with the accompanying drawings and this background.

BRIEF SUMMARY

Integrated circuits and methods of operating and producing the same are provided. In an exemplary embodiment, an integrated circuit includes a look up table with a first and second memory cell. The first memory cell includes a first magneto electric (ME) layer, a first free layer adjacent to the first ME layer, and a first fixed layer. The second memory cell includes a second ME layer, a second free layer adjacent to the second ME layer, and a second fixed layer. A first word line is in direct communication with the first and second free layers, wherein direct communication is a connection through zero, one, or more intervening components that are electrical conductors such that the connection is free of both a semiconductor and an insulator. A first bit line is in direct communication with the first ME layer, and a second bit line is in direct communication with the second ME layer.

A method of operating an integrated circuit is provided in another exemplary embodiment. The method includes setting a first word line at one of a positive write voltage, a negative write voltage, or a ground, where the first word line is in communication with a first magneto electric (ME) layer of a first memory cell. The first word line is also in communication with a second ME layer of a second memory cell, where the first and second memory cells are within a look up table. Communication is the ability for a voltage to be applied. The positive write voltage is greater than a program voltage of the first memory cell. A first bit line is set at one of the ground, a positive partial voltage, or a negative partial voltage, where the positive partial voltage is less than the program voltage. The first bit line is in communication with a first free layer of the first memory cell. A second bit line is set at one of the ground, the positive partial voltage, or the negative partial voltage, where the second bit line is in communication with a second free layer of the second memory cell.

A method of producing an integrated circuit is provided in another embodiment. The method includes forming a look up table with a first and second memory cell, and forming a first word line in direct communication with the first and second memory cells. Direct communication is a connection through zero, one, or more intervening components that are electrical conductors such that the connection is free of both a semiconductor and an insulator. A first bit line is formed in direct communication with the first memory cell, and a second bit line is formed in direct communication with the second memory cell.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes a look up table with magneto electric magnetic tunnel junction memory cells. The look up table has separate read and write circuits, where the input circuit is utilized to enter an input that is converted to an output by the look up table and the write circuit is utilized to program the look up table. As such, the read circuit includes different components from the write circuit, and vice versa. The magneto electric aspect of the memory cells allows for the free layer to be programmed by applying a voltage across a magneto electric (ME) layer, where the voltage matches or exceeds a program voltage for the memory cell. By controlling the voltage in bit and word lines, the memory cells of the look up table can be written to without the use of a protecting access transistor. Typical look up tables include an access transistor associated with the write circuit for each memory cell of each look up table. In this description, no access transistors are required with the write circuit of the look up table, so the space typically taken by the access transistors can be utilized for other purposes. Furthermore, the electric field utilized to write to the memory cell does not require a current, so the amount of energy used to write to the look up tables is reduced.

Figure 1:
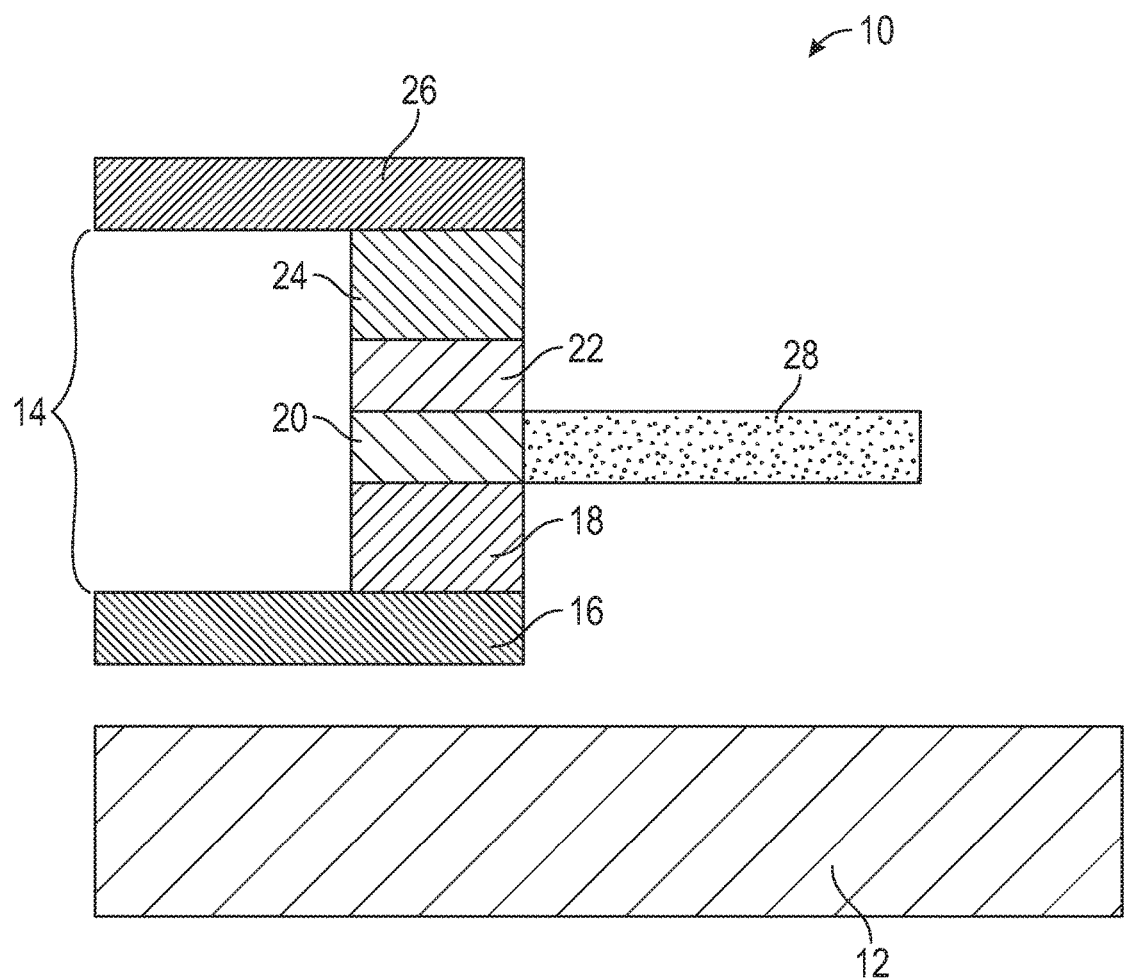
FIG. 1 is a side sectional view of a portion of an integrated circuit in accordance with an exemplary embodiment.

Referring to an exemplary embodiment illustrated in FIG. 1, an integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent based on the total weight of the referenced component or material, unless otherwise indicated. In many embodiments, the substrate 12 primarily includes a monocrystalline semiconductor material. The term "primarily includes," as used herein, means the specified material is present in the specified component at a concentration of at least about 50 weight percent, based on a total weight of the component. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

The embodiment currently illustrated depicts a memory cell 14, described more fully below, overlying the substrate 12, where the gap between the substrate 12 and the memory cell 14 indicates that intervening layers may be present, such as one or more interlayer dielectrics. Electronic components may also be positioned between the substrate 12 and the memory cell 14 in some embodiments, such as transistors, resistors, capacitors, diodes, etc. However, in alternate embodiments the memory cell 14 may be produced directly on the substrate 12 such that there is no gap therebetween. As used herein, the term "overlying" means "over" such that an intervening layer may lie between the overlying component (the memory cell 14 in this example) and the underlying component (the substrate 12 in this example), or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of FIG. 1. It is to be understood that spatially relative terms refer to the orientation in FIG. 1, so if the integrated circuit 10 were to be oriented in another manner the spatially relative terms would still refer to the orientation depicted in FIG. 1. Thus, the exemplary terms "over" and "under" remain the same even if the device is twisted, flipped, or otherwise oriented other than as depicted in the figures.

A lower electrode 16 is formed overlying the substrate 12, where the lower electrode 16 is formed of an electrically conductive material. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^4$ ohm meters to less than about $1 \times 10^4$ ohm meters. The lower electrode 16 overlies the substrate 12, and may be lithographically positioned at a desired location. In an exemplary embodiment, the lower electrode 16 includes strontium ruthenium oxide ($SrRuO_3$), which can be deposited by pulsed laser deposition techniques. Other deposition techniques or materials are possible in alternate embodiments, but the lower electrode 16 may be formed of a material that aids in producing a desired multi-ferroic property in the overlying layer described below.

An ME layer 18 may then be formed and patterned overlying the lower electrode 16, where the ME layer 18 and the lower electrode 16 are in physical contact. In some embodiments, the lower electrode 16 may form two or more physical contact points with the ME layer 18 (not illustrated). An exemplary ME layer 18 is an electrical insulator, and includes bismuth ferrite ($BiFeO_3$, sometimes referred to as BFO), chromium oxide ($Cr_2O_3$), or other materials with an appropriate multi-ferroic nature that serve as magneto electric materials. BFO can be formed by pulsed laser deposition, sputtering, chemical vapor deposition, or other techniques. A free layer 20 is formed overlying the ME layer 18, and the free layer 20 may be in direct contact with the ME layer 18 in some embodiments. The free layer 20 is an electrical conductor and a magnetic material, and may include cobalt iron (CoFe) in some embodiments. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "nonmagnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about one week after being removed from an induction magnetic field.

A tunnel barrier layer 22 is formed overlying the free layer 20, and a fixed layer 24 is formed overlying the tunnel barrier layer 22. In alternate embodiments, the tunnel barrier layer 22 may overlie the fixed layer 24 and underlie the free layer 20, instead of the other way around, but in all embodiments the tunnel barrier layer 22 is between the fixed and free layers 24, 20. Also, the ME layer 18 is adjacent to the free layer 20 in all embodiments, where the free layer 20 is positioned between the ME layer 18 and the tunnel barrier layer 22. The tunnel barrier layer 22 may include magnesium oxide in an exemplary embodiment, but the tunnel barrier layer 22 may include aluminum oxide or other materials in various embodiments. The tunnel barrier layer is non-magnetic.

The fixed layer 24 is an electrical conductor and magnetic, and may include one or more of cobalt, platinum, iron, boron, palladium, nickel, gadolinium, or other elements in various embodiments. The different elements may be alloyed, formed as successive layers, or otherwise combined in different embodiments. The fixed and free layer 24, 20 may include more than one magnetic layers interspaced with non-magnetic spacer layers (not illustrated) between successive magnetic layers in some embodiments, but other embodiments are also possible. The ME layer 18, the free layer 20, the tunnel barrier layer 22, and the fixed layer 24 form a memory cell 14, as mentioned above. The memory cell 14 produces a magneto electric effect, particularly at standard temperatures from about −20 degrees Celsius (° C.) to about 50° C. The magneto electric effect can be observed at any temperature below the Neel temperature. As an example, for BFO this temperature is below about 407° C. However, depending on doping conditions, this temperature can change. The ME layer 18, free layer 20, tunnel barrier layer 22, and fixed layer 24 may be, in sequence, BFO/NiFe/MgO/CoFe, or $CrO_2$/NiFe/MgO/NiFe, or other combinations known to produce the magneto electric effect.

An upper electrode 26 is formed overlying the fixed layer 24 in an exemplary embodiment, where the upper electrode 26 is in electrical communication with memory cell 14, such as with the fixed layer 24 in the illustrated embodiment in FIG. 1. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating. The upper electrode 26 is an electrical conductor, and includes copper, aluminum, or other conductive materials in various embodiments. In an exemplary embodiment, the upper electrode 26 includes copper, which can be deposited using a damascene process by forming a trench, depositing copper by electroless or electrolytic plating from a solution such as a sulfuric acid copper bath, and subsequently performing chemical mechanical planarization to remove the copper except for within the trench. A free layer electrode 28 is formed in electrical communication with the free layer 20, where the free layer electrode 28 is an electrical conductor. The free layer electrode 28 may be formed from a wide variety of conductive materials, as described above for the upper electrode 26. Other embodiments of the memory cell 14 are possible, but all embodiments include an ME layer 18, a free layer 20, a tunnel barrier layer 22, and a fixed layer 24. However, the orientation and electrode configuration may vary within the limitations described above.

The memory cell 14 is a magneto electric memory cell 14, as mentioned above. Application of an electric field across the ME layer 18 at a program voltage or greater induces the magnetic properties of the free layer 20 to align in a predetermined manner. As such, the application of a positive or negative voltage across the ME layer 18, where the voltage is equal to or greater than the program voltage, can be used to change the magnetic orientation of the free layer 20 relative to the fixed layer 24, where the magnetic orientation of the fixed layer 24 remains the same when the orientation of the free layer 20 is changed. As such, a voltage applied between the lower electrode 16 and the free layer electrode 28 produces an electric field across the ME layer 18. However, the ME layer 18 is an electrical insulator so almost no current flows despite the voltage drop. As such, the magnetic orientation of the free layer 20 can be changed with very low energy, because there is almost no current across the ME layer 18. In a similar manner, the memory cell 14 can be read by testing the resistance between the upper electrode 26 and the free layer electrode 28. The resistance between the upper electrode 26 and the free layer electrode 28 is greater when the free layer 20 is magnetically anti-parallel to the fixed layer 24 than when the free layer is magnetically parallel to the fixed layer 24. As such, reading and writing to the memory cell 14 utilizes different electrode paths, so the reading and writing operations can be separated.

Figure 2:
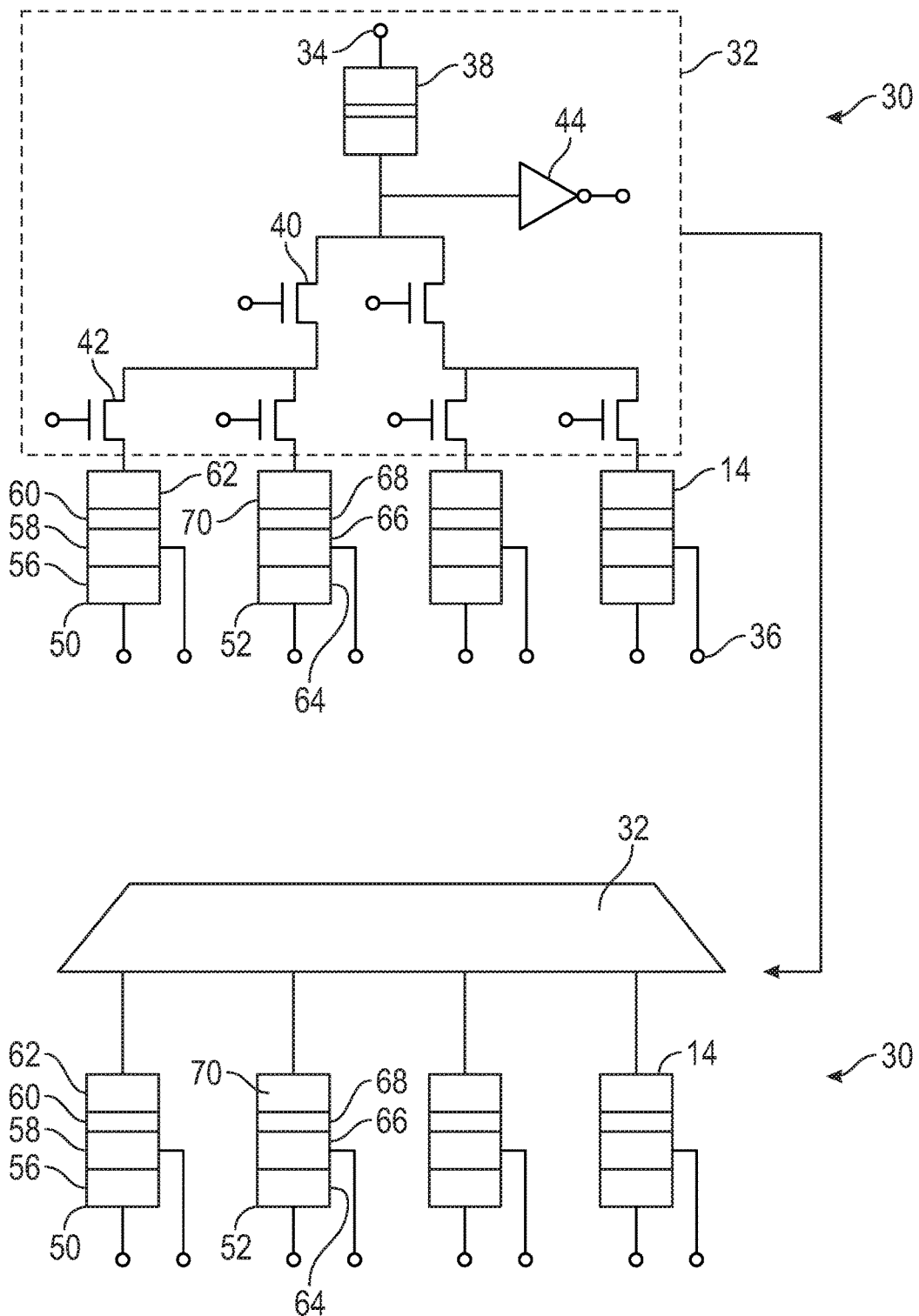
FIGS. 2 and 3 are circuit diagrams of embodiments of an integrated circuit.

Reference is made to an exemplary embodiment illustrated in FIG. 2. A look up table 30 includes a read circuit 32 and a plurality of memory cells 14. The read circuit 32 includes a first terminal 34 connected to a read voltage during the read operation, and a second terminal 36 connected to a ground. The read circuit 32 is configured to accept an input signal at the gates of the A level read transistor(s) 40 and the B level read transistors 42, and produce an output signal at the output of read node inverter 44. The configuration of the read circuit 32 is such that the output signal generated at the output of the read node inverter 44 may vary depending on the programming of the look up table 30. The read circuit 32 may be configured in a variety of manners, and embodiments with more of fewer electronic components than illustrated are possible. In the illustrated embodiment, the read circuit 32 includes a read resistor 38, two A level read transistors 40, four B level read transistors 42, and a read node inverter 44. In the illustrated embodiment the read circuit 32 is illustrated as a trapezoid for simplicity's sake in subsequent figures. The read circuit 32 is in electrical communication with each memory cell 14 within the look up table 30. The number of transistors in the read circuit 32 depends on the number of memory cells 14 utilized.

The look up table 30 includes a plurality of memory cells 14, as mentioned above, where the plurality of memory cells 14 include a first memory cell 50 and a second memory cell 52. Look up tables 30 typically include a plurality of memory cells 14, where the number of memory cells 14 is an integral power of two, such as two, four, eight, sixteen, etc. However, other embodiments with a different number of memory cells 14 are also possible. This description specifically names the first and second memory cells 50, 52 with the understanding that the look up table 30 may include additional memory cells 14 that are not individually named. The description for the first and second memory cells 14 is generally applicable for other memory cells 14 within the look up table 30. The first memory cell 50 includes a first ME layer 56, a first free layer 58, a first tunnel barrier layer 60, and a first fixed layer 62, where these layers are as described above but are within the first memory cell 50. In a similar manner, the second memory cell 52 includes a second ME layer 64, a second free layer 66, a second tunnel barrier layer 68, and a second fixed layer 70.

Figure 3:
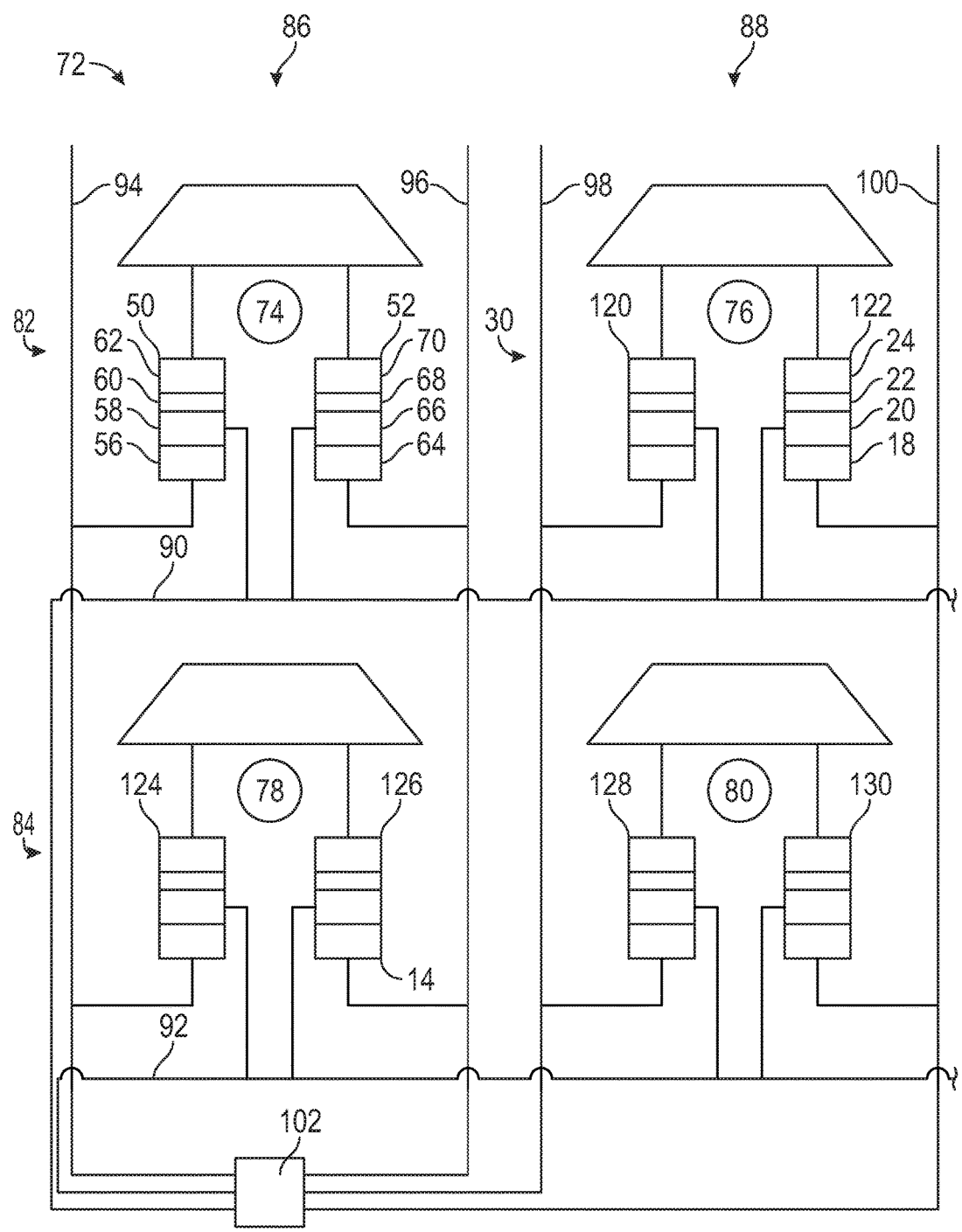

Referring to an exemplary embodiment illustrated in FIG. 3, with continuing reference to FIG. 2, a field programmable gate array 72 includes a plurality of look up tables 30, including a first look up table 74, a second look up table 76, a third look up table 78, and a fourth look up table 80. Each look up table 30 illustrated in FIG. 3 includes a two memory cells 14, but the look up tables 30 may include more memory cells 30 in alternate embodiments. In the illustrated embodiment, the first and second look up tables 74, 76 are within a first row 82, the third and fourth look up tables 78, 80 are within a second row 84, the first and third look up tables 74, 78 are within a first column 86, and the second and fourth look up tables 76, 80 are within a second column 88. As a general matter, the first row 82 includes a plurality of look up tables 30 of the first row, the second row 84 includes a plurality of look up tables 30 of the second row, and so on for any other rows that may be present, wherein each look up table of each row includes a plurality of memory cells 14. In the same fashion, each of the first or second columns 86, 88 include a plurality of memory cells 14 of the first or second columns, respectively, where each of the plurality of memory cells 14 of any column include a plurality of memory cells 14. To better illustrate the details, the two memory cells 14 of the second look up table 76 are referred to as the third memory cell 120 and the fourth memory cell 122, the third look up table 78 includes the fifth memory cell 124 and the sixth memory cell 126, and the fourth look up table 80 includes the seventh memory cell 128 and the eighth memory cell 130.

A first word line 90 is in direct communication with the free layer 20 in every memory cell 14 in the first row, and a second word line 92 is in direct communication with the free layer 20 of every memory cell 14 in the second row. As used herein, "direct communication" is a connection through zero, one, or more intervening components that are electrical conductors such that the connection is free of both a semiconductor and an insulator. The ME layers are electrical insulators, so the term "direct communication" is used in place of electrical communication. Furthermore, the term "communication," a used herein, means the ability for a voltage to be applied. Therefore, the term "direct communication" means communication free of a transistor, a capacitor, or other electrical components that include semiconductors or insulators. A first component that is direct communication with a second component is also in communication with that second component. As such, the first word line 90 is in direct communication with the first and second free layers 58, 66 of the first and second memory cells 50, 52, and the first word line 90 is in direct communication with the free layers 20 of the third and fourth memory cells 120, 122. The second word line 92 is in direct communication with the free layers 20 of the fifth, sixth, seventh, and eighth memory cells 124, 126, 128, 130 in the third and fourth look up tables 78, 80 of the second row 84.

A first bit line 94 is in direct communication with the ME first layer 56 of the first memory cell 50 of the first look up table 74, and with the fifth memory cell 124 of the third look up table 78, which corresponds to one of the memory cells 14 in each look up table 30 within the first column 86. As such, the first bit line 94 is in direct communication the first ME layer 56 of the first memory cell 50 of the first look up table 74, and with the ME layer 18 of the fifth memory cell 124 of the third look up table 78. A second bit line 96 is in direct communication with the ME layer 18 of the second memory cell 52 and the sixth memory cell 126 in the first column 86. As such, the second bit line 96 is in direct communication with the ME layer 64 of the second memory cell 52 of the first look up table 74, and with the ME layer 18 of the sixth memory cell 126 of the third look up table 78. A third bit line 98 and a fourth bit line 100 are in direct communication with the ME layers 18 in the second column 88 in the same manner as described for the first and second bit lines 94, 96 and the first column 86. As such, the third bit line 98 is in direct communication with the ME layer 18 of the third and seventh memory cells 120, 128, and the fourth bit line 100 is in direct communication with the ME layer 18 of the fourth and eighth memory cells 120, 130. In embodiments with more than two memory cells 30 per look up table 30, there would be more bit lines associated with each column. Each bit line 94, 96, 98, 100 is in direct communication with one memory cell 14 within each look up table 30 in each of the rows 82, 84.

The first and second word lines 90, 92 and the first, second, third, and fourth bit lines 94, 96, 98, 100 are all in electrical communication with a write circuit 102. The write circuit 102 is configured to set voltages at each of the word and bit lines within the field programmable gate array 72. The write circuit 102 is different from the read circuit 32, and the write circuit 102 is independent from the read circuit 32 such that the write circuit 102 can program memory cells 14 primarily using electronic components different from those used by the read circuit 32.

As mentioned above, each memory cell 14 is programmed, or written to, by an electric charge placed across the ME layer 18. Also as illustrated, each memory cell 14 is in direct communication (i.e., free of an insulator, a semiconductor, a transistor, or a capacitor) with the bit and word lines. Each memory cell 14 in the field programmable gate array 72 can be independently programmed without accidentally programming another memory cell 14. This is done by the write circuit 102, where the write circuit 102 sets the voltage of the first and second word lines 90, 92 (and any additional word lines in larger field programmable gate arrays 72) at one of (i) a positive write voltage, (ii) a negative write voltage, or (iii) a ground. The write circuit 102 also sets the voltage of the first, second, third, and fourth bit lines 94, 96, 98, 100 (and any additional bit lines in larger field programmable gate arrays 72 or larger look up tables) at one of (a) a positive partial voltage, (b) a negative partial voltage, or (c) a ground. The positive write voltage is greater than or equal to the program voltage for each of the memory cells 14 within the field programmable gate array 72, and the positive partial voltage is less than the program voltage for the memory cells 14. In a similar manner, the absolute value of the negative write voltage is greater than or equal to the program voltage for each of the memory cells 14 within the field programmable gate array 72, and the absolute value of the negative partial voltage is less than the program voltage for the memory cells 14. The difference between the positive write voltage and the positive partial voltage is less than the program voltage, and the absolute value of the difference between the negative write voltage and the negative partial voltage is also less than the program voltage. In general, the absolute value of the negative write voltage and the negative partial voltage is about the same as positive write voltage and the positive partial voltage, respectively.

The programming (or writing) to each individual memory cell 14 within the field programmable gate array 72 is possible, as mentioned above. The following examples illustrate programming protocols.

Example 1

Programming of the first memory cell 50 of the first look up table 74 with a positive write voltage greater than the program voltage. The first word line 90 is set at the positive write voltage, and the second word line 92 is set at ground.

The first bit line 94 is set at ground, and the second, third, and fourth bit lines 96, 98, 100 are set at the positive partial voltage. As such, the first ME layer 56 of the first memory cell 50 of the first look up table 74 is exposed to a positive write voltage from the first word line 90, and a ground from the first bit line 94. This produces an electric field that is equal to or greater than the program voltage, so the first free layer 58 of the first memory cell 50 of the first look up table 74 is programmed. The second memory cell 52, the third memory cell 120, and the fourth memory cell 122 of the first and second look up tables 74, 76 are exposed to the positive write voltage from the first word line 90, but they are exposed to a positive partial voltage from the second, third, and fourth bit lines 96, 98, 100. Therefore, the electric field is the difference between the positive write voltage and the positive partial voltage, which is less than the program voltage. The fifth, sixth, seventh and eight memory cells 124, 126, 128, 130 from the third and fourth look up tables 78, 80 in the second row 84 are all exposed to the ground from the second word line 92, and to the positive partial voltage from the first, second, third, and fourth bit lines 94, 96, 98, 100. As such, the only memory cell 14 that is exposed to a voltage equal to or greater than the program voltage is the first memory cell 50 of the first look up table 74. In a similar manner, any memory cell 14 can be independently written to without writing to another memory cell 14. It is also possible to write to more than one memory cell 14 at the same time, if desired, by setting the voltages of the bit and word lines appropriately.

Example 2

Programming of the second memory cell 52 of the first look up table 74 with a negative voltage. In general, when a programming word line is set at the positive write voltage, the other word lines are set at a ground, the programming bit line is set at the ground, and the other bit lines are set at a positive partial voltage, where the programming bit and word lines are the bit and word lines that intersect at the memory cell 14 to be programmed. In a similar manner, if the programming word line is set at a negative write voltage, the bit lines other than the programming bit line are set at the negative partial voltage, so positive write voltages are used with positive partial voltages and negative write voltages are used with negative partial voltages. To program the second memory cell 52 of the first look up table 74 with a negative voltage, the first word line 90 is set at the negative write voltage and the second word line 92 is set at the ground. The second bit line 96 is set at the ground, and the first, third and fourth bit lines 94, 98, 100 are set at the negative partial voltage.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:
1. An integrated circuit comprising:
   a look up table comprising a first memory cell and a second memory cell, wherein the first memory cell comprises a first magneto electric (ME) layer, a first free layer adjacent to the first ME layer, and a first fixed layer, wherein the second memory cell comprises a second ME layer, a second free layer adjacent to the second ME layer, and a second fixed layer;
   a first word line in direct communication with the first free layer and the second free layer, wherein direct communication is a connection through zero, one, or more intervening components that are electrical conductors such that the connection is free of both a semiconductor and an insulator;
   a first bit line in direct communication with the first ME layer;
   a second bit line in direct communication with the second ME layer; and
   a write circuit in electrical communication with the first word line, wherein the write circuit is configured to change a voltage of the first word line between a positive write voltage, a negative write voltage, and a ground.
2. The integrated circuit of claim 1 wherein the write circuit is in electrical communication with the first bit line and the second bit line.
3. The integrated circuit of claim 2 further comprising:
   a read circuit in electrical communication with the first memory cell and the second memory cell, where the read circuit is different from the write circuit.
4. The integrated circuit of claim 3 wherein the read circuit is independent from the write circuit.
5. The integrated circuit of claim 2 wherein the write circuit is configured to change a voltage of the first bit line between the ground, a positive partial voltage, or a negative partial voltage, wherein the positive partial voltage is less than the positive write voltage, and wherein the write circuit is configured to set the second bit line at the ground, the positive partial voltage, or the negative partial voltage.
6. The integrated circuit of claim 5 wherein an absolute value of the negative write voltage is about the same as the positive write voltage, and wherein an absolute value of the negative partial voltage is about the same as the positive partial voltage.
7. The integrated circuit of claim 5 wherein the first memory cell has a program voltage, wherein application of the program voltage to the first ME layer sets a magnetic direction of the first free layer.
8. The integrated circuit of claim 7 wherein the positive write voltage is equal to or greater than the program voltage, and wherein the positive partial voltage is less than the program voltage.
9. The integrated circuit of claim 1 wherein:
   the look up table comprises more than two memory cells.
10. A method of operating an integrated circuit comprising:
    setting a first word line at one of a positive write voltage, a negative write voltage, or a ground, wherein a write circuit in electrical communication with the first word line is configured to change a voltage of the first word line between the positive write voltage, the negative write voltage, and the ground, wherein the first word line is in communication with a first magneto electric (ME) layer of a first memory cell, wherein the first word line is in communication with a second ME layer of a second memory cell, wherein communication is the ability for a voltage to be applied, wherein the first memory cell and the second memory cell are within a look up table, and wherein the positive write voltage is greater than a program voltage of the first memory cell;
setting a first bit line at one of the ground, a positive partial voltage, or a negative partial voltage, wherein the first bit line is in communication with a first free layer of the first memory cell, and wherein the positive partial voltage is less than the program voltage; and
setting a second bit line at one of the ground, the positive partial voltage, or the negative partial voltage, wherein the second bit line is in communication with a second free layer of the second memory cell.

11. The method of claim 10 wherein:
a first row comprises a plurality of look up tables of the first row, wherein each of the plurality of look up tables of the first row comprises a plurality of memory cells; and wherein
setting the first word line comprises setting the first word line at one of the positive write voltage, the negative write voltage, or the ground, wherein the first word line is in communication with each of the plurality of memory cells in the plurality of look up tables of the first row.

12. The method of claim 11 wherein:
a first column comprises a plurality of look up tables of the first column, wherein each of the plurality of look up tables of the first column comprises the plurality of memory cells; and wherein
setting the first bit line comprises setting the first bit line at one of the ground, the positive partial voltage, or the negative partial voltage, wherein the first bit line is in communication with one of the plurality of memory cells in each of the plurality of look up tables of the first column.

13. The method of claim 10 wherein:
setting the first word line comprises setting the first word line at one of the positive write voltage, the negative write voltage, or the ground, wherein the first word line is in direct communication with the first ME layer of the first memory cell and the second ME layer of the second memory cell, wherein direct communication is a connection through zero, one, or more intervening components that are electrical conductors such that the connection is free of both a semiconductor and an insulator.

14. The method of claim 13 wherein:
setting the first bit line comprises setting the first bit line at one of the ground, the positive partial voltage, or the negative partial voltage, wherein the first bit line is in direct communication with the first free layer of the first memory cell.

15. The method of claim 14 wherein:
setting the second bit line comprises setting the second bit line at one of the ground, the positive partial voltage, or the negative partial voltage, wherein the second bit line is in direct communication with the second free layer of the second memory cell.

16. The method of claim 10 wherein programming the look up table comprises:
setting the first word line at the positive write voltage;
setting the first bit line at one of the ground; and
setting the second bit line at one of the positive partial voltage.

17. The method of claim 10 wherein:
setting the first word line comprises setting the first word line at the ground or the positive write voltage;
setting the first bit line comprises setting the first bit line at the ground or the positive partial voltage; and
setting the second bit line comprises setting the second bit line at the ground or the positive partial voltage.

18. The method of claim 10 wherein:
setting the first word line comprises setting the first word line at the ground or the negative write voltage;
setting the first bit line comprises setting the first bit line at the ground or the negative partial voltage; and
setting the second bit line comprises setting the second bit line at the ground or the negative partial voltage.

19. The method of claim 10 further comprising:
reading the look up table, wherein reading the look up table comprises utilizing a read circuit that is independent of the first word line, the first bit line, and the second bit line.

20. A method of producing an integrated circuit comprising:
forming a look up table comprising a first memory cell and a second memory cell;
forming a first word line in direct communication with the first memory cell and the second memory cell, wherein direct communication is a connection through zero, one, or more intervening components that are electrical conductors such that the connection is free of both a semiconductor and an insulator;
forming a first bit line in direct communication with the first memory cell;
forming a second bit line in direct communication with the second memory cell; and
forming a write circuit in electrical communication with the first word line, wherein the write circuit is configured to change a voltage of the first word line between a positive write voltage, a negative write voltage, and a ground.

\* \* \* \* \*